(12) United States Patent
Bird et al.

(10) Patent No.: US 11,057,984 B2
(45) Date of Patent: Jul. 6, 2021

(54) HIGH-SPEED HYBRID CIRCUIT

(71) Applicant: Finisar Corporation, Sunnyvale, CA (US)

(72) Inventors: Steven C. Bird, San Jose, CA (US); Henry Meyer Daghighian, Redwood City, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/199,484

(22) Filed: Nov. 26, 2018

(65) Prior Publication Data

US 2019/0166684 A1 May 30, 2019

Related U.S. Application Data

(60) Provisional application No. 62/592,945, filed on Nov. 30, 2017.

(51) Int. Cl.
*H05K 1/02* (2006.01)
*H05K 3/00* (2006.01)
(Continued)

(52) U.S. Cl.
CPC ....... *H05K 1/0203* (2013.01); *H01S 5/02253* (2021.01); *H01S 5/02325* (2021.01); *H01S 5/02345* (2021.01); *H01S 5/02469* (2013.01); *H05K 1/021* (2013.01); *H05K 1/0204* (2013.01); *H05K 1/181* (2013.01); *H05K 3/0026* (2013.01); *H05K 3/0044* (2013.01); *H05K 3/4007* (2013.01); *H01S 5/183* (2013.01); *H05K 1/024* (2013.01); *H05K 1/028* (2013.01); *H05K 2201/09845* (2013.01); *H05K 2201/09854* (2013.01); *H05K 2201/10121* (2013.01);
(Continued)

(58) Field of Classification Search
CPC ........................................................ H05K 1/02
See application file for complete search history.

(56) References Cited

U.S. PATENT DOCUMENTS 4,737,395 A * 4/1988 Mabuchi ................. H01L 23/13
                                                                                               174/255
6,029,343 A     2/2000 Wieloch
(Continued)

FOREIGN PATENT DOCUMENTS

CN        105 722 302       6/2016

OTHER PUBLICATIONS

Invitation to Pay Additional Fees and, Where Applicable, Protest Fee mailed Mar. 1, 2019, in related PCT Application No. PCT/US2018/063355.

*Primary Examiner* — Jerry Wu
(74) *Attorney, Agent, or Firm* — Blank Rome LLP

(57) ABSTRACT

A circuit includes a printed circuit board including a first portion defining a window formed as a first void on a first side of the printed circuit board and a second portion defining a cavity formed as a second void opposite the first void on a second side of the printed circuit board. The circuit further includes a heat sink inserted in the second void, the heat sink having a first side forming a bottom of the first void and the bottom of the first void within the printed circuit board. The circuit yet further includes at least one electronic circuit die mounted to the first side of the heat sink and electrically coupled to the first side of the printed circuit board.

10 Claims, 10 Drawing Sheets

(51) Int. Cl.
     H05K 3/40       (2006.01)
     H05K 1/18       (2006.01)
     H01S 5/024      (2006.01)
     H01S 5/02253    (2021.01)
     H01S 5/02325    (2021.01)
     H01S 5/02345    (2021.01)
     H01S 5/183      (2006.01)

(52) U.S. Cl.
     CPC .......... H05K 2201/10287 (2013.01); H05K 2201/10416 (2013.01); H05K 2203/049 (2013.01)

(56) References Cited

U.S. PATENT DOCUMENTS

2010/0238635 A1    9/2010   Yang et al.
2015/0296610 A1*  10/2015   Daghighian ........... G02B 6/122
                                                          385/14

* cited by examiner

HIGH-SPEED HYBRID CIRCUIT

CROSS-REFERENCE TO RELATED APPLICATION

This application claims the benefit of and priority to U.S. Provisional Patent Application No. 62/592,945 filed on Nov. 30, 2017, which is incorporated herein by reference.

BACKGROUND

Field

The embodiments discussed herein relate to high-speed circuits. In particular, embodiments relate to circuit boards with a heat sink.

Relevant Technology

Electronic modules, such as optoelectronic transceiver or transponder modules, are increasingly used in electronic and optoelectronic communication. Optoelectronic modules generally include one or more transmitters and/or receivers, as well as one or more printed circuit boards (PCBs) with circuitry related to the transmitters/receivers, such as driving and amplifying circuitry. Electrical data signals generally pass through this circuitry as they pass between the transmitters/receivers and a host device in which the optoelectronic module may be positioned.

It is desirable for optoelectronic communication to send and receive data signals having ever higher frequencies in order to increase the rate at which data may be communicated via the optoelectronic modules. However, increasing data signal frequencies may present a number of difficulties in designing optoelectronics modules. In particular, increasing data signal frequencies may lead to signal degradation and lower noise margins in circuits designed using techniques that are less tolerable for lower data rates.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Embodiments described herein generally relate to systems for transmission of high-speed signals. In particular, embodiments may relate to circuit boards with die mounted below a top or outer surface of the circuit board for use in optoelectronic devices.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In one embodiment, a circuit includes a printed circuit board including a first portion defining a window formed as a first void on a first side of the printed circuit board and a second portion defining a cavity formed as a second void opposite the first void on a second side of the printed circuit board. The printed circuit board further includes a heat sink inserted in the second void, with the heat sink having a first side forming a bottom of the first void and the bottom of the first void within the printed circuit board. The printed circuit board further includes at least one electronic circuit die mounted to the first side of the heat sink and electrically coupled to the first side of the printed circuit board.

In another embodiment, an optoelectronic module includes an optical transmitter, an optical receiver, and a circuit. The circuit includes a printed circuit board including a first portion defining a window formed as a first void on a first side of the printed circuit board and a second portion defining a cavity formed as a second void opposite the first void on a second side of the printed circuit board. The circuit further includes a heat sink inserted in the second void, the heat sink having a first side forming a bottom of the first void and the bottom of the first void within the printed circuit board. The circuit yet further includes at least one electronic circuit die mounted to the first side of the heat sink and electrically coupled to the first side of the printed circuit board.

In yet another embodiment, a circuit includes a multilayer rigid flex circuit board including a first outer surface and a second outer surface. The multilayer rigid flex circuit board further includes at least one cap layer including a first outer surface and a second outer surface, where the first outer surface may be configured for transceiving electrical signals between at least one electronic circuit die and a host system of the circuit and the second outer surface may be formed on the first outer surface of the multilayer rigid circuit board. The multilayer rigid flex circuit board yet further includes a heat sink including a first outer surface forming a mounting surface for at least one electronic circuit die. Further, the heat sink may be mounted at least partially within a portion of the multilayer rigid flex circuit board defining a cavity in the multilayer rigid circuit with the first outer surface of the heat sink configured between the first outer surface of the at least one cap layer and the second outer surface of the multilayer rigid circuit board.

In yet a further embodiment, a method includes routing a cavity from a first outer surface of a multilayer rigid flex circuit board at least partially through the multilayer rigid flex circuit board. The method further includes cutting a window from a first outer surface of a cap layer to the cavity, where the cap layer may be attached at a second outer surface of the cap layer to a second outer surface of the multilayer rigid flex circuit board. The method further includes mounting a heat sink in the cavity with a first outer surface of the heat sink configured for mounting at least one electronic circuit die thereon.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DESCRIPTION OF EMBODIMENTS

One problem with traditional dual-side connector rigid flex PCBs is that ordinary rigid flex PCB design techniques may be used to create optoelectronic circuits for only relatively low-speed data transmission frequencies. However, as data signal frequencies increase, using ordinary rigid flex PCB design techniques to create a high-speed optoelectronic circuit results in unacceptable signal degradation and reduced noise margins. For example, signal degradation may occur due to plated through-hole vias, transmission line interconnects and/or interfaces, and/or mismatched impedance connections running from the top of the rigid section to the bottom of the rigid section. As a result, rigid flex PCBs developed using ordinary rigid flex PCB design techniques are typically unsuitable for transmitting signals having data rates above about 25 gigabits per second (Gb/s).

To bring the signal degradation within acceptable levels, a flexible PCB and a rigid ceramic laminate such as a low-temperature co-fired ceramic (LTCC) may be soldered together using ball grid array (BGA) soldering. The ceramic laminate may include high frequency vias, transmission lines, and ground reference interfaces required, while the flexible circuit may be contorted to take advantage of the three-dimensional space within the optoelectronic module. However, such a solution may be expensive and demand significant assembly effort.

As disclosed by embodiments herein, a hybrid or rigid flex circuit suitable for transmitting signals having data rates above 25 Gb/s can be constructed. Rigid flex circuits may be comparatively inexpensive to manufacture and/or may demand a comparatively minimal assembly effort.

Reference will now be made to figures wherein like structures will be provided with like reference designations. It is understood that the drawings are diagrammatic and schematic representations of exemplary embodiments, and are not limiting of the present invention nor are they necessarily drawn to scale.

Figure 1:
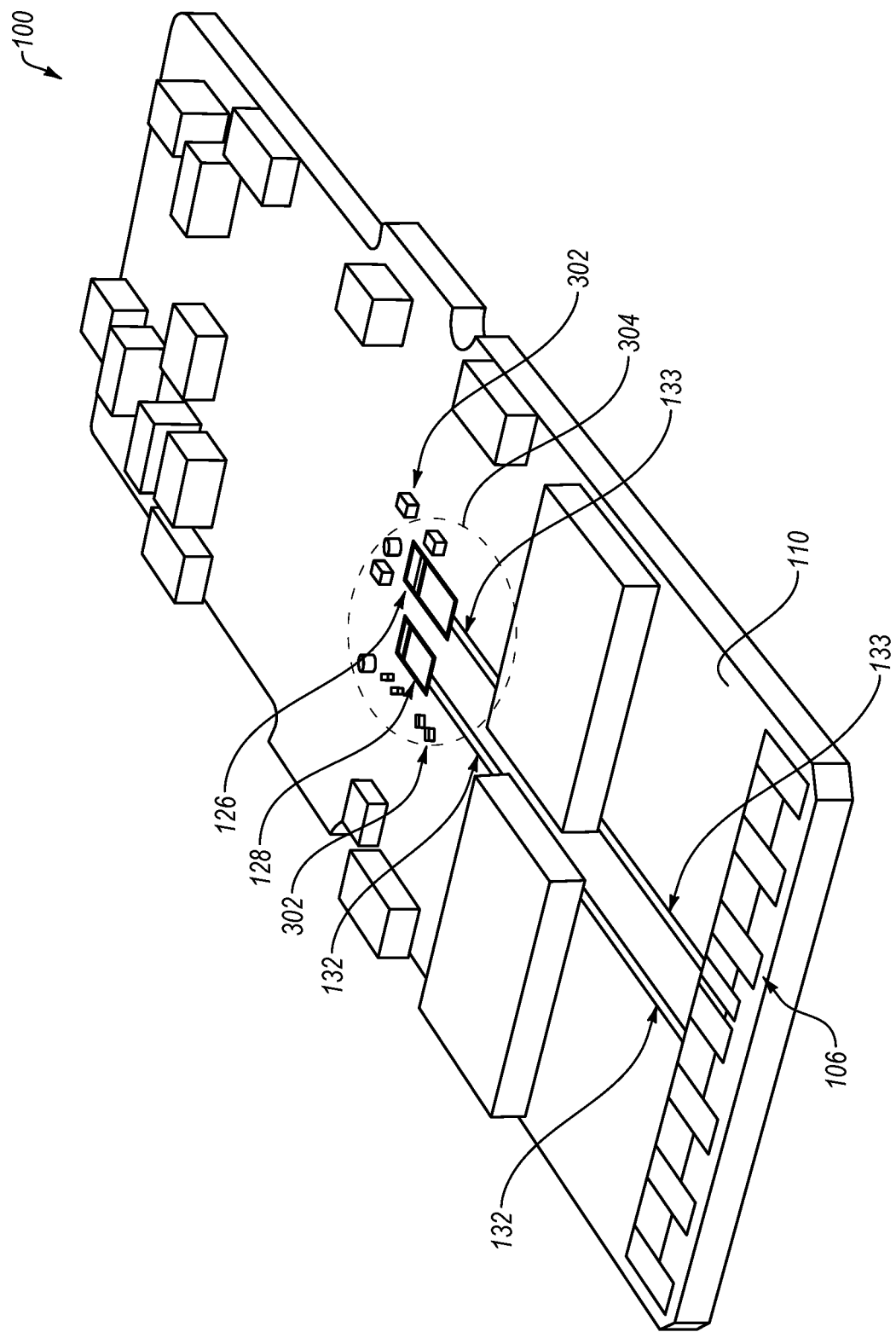
FIG. 1 illustrates a first perspective view of an example optoelectronic module.

FIG. 1 illustrates a first perspective view of an example optoelectronic module 100. The optoelectronic module 100 may be used to transmit and receive optical signals in communication with one or more other devices on a network and to communicate by way of electrical signals with a host device. The example optoelectronic module 100 may include a rigid flex PCB 110 suitable for transmitting signals having data rates above about 14 Gb/s. Including the rigid flex PCB 110 in the optoelectronic module 100 may lower manufacturing costs for the optoelectronic module 100. The rigid flex PCB 110 may be more cost effective to manufacture than other circuits able to transmit signals having data rates above about 25 Gb/s, particularly compared to other circuits including flexible and rigid sections.

The optoelectronic module 100 may include a transmitter components 126 and a receiver components 128 for respectively transmitting and receiving optical signals by way of an optical communication cable (not shown) connected to the optoelectronic module 100 by way of an alignment guide (not shown) and a shell (not shown). While the various embodiments may make reference to optical communication, the various methods and circuits described herein are not so limited.

The optoelectronic module 100 may be configured for optical signal transmission and reception at a variety of data rates. Further, the optoelectronic module 100 may be configured for optical signal transmission and reception at various wavelengths including, but not limited to, 850 nanometer (nm), 1310 nm, 1470 nm, 1490 nm, 1510 nm, 1530 nm, 1550 nm, 1570 nm, 1590 nm, 1610 nm, or longer wavelengths. The optoelectronic module 100 may be configured to support various communication protocols including, but not limited to, INFINIBAND, Fast Ethernet, Gigabit Ethernet, 10 Gigabit Ethernet, Fibre Channel, and SONET. Although the example optoelectronic module 100 may be configured to be substantially compliant with the quad small form-factor pluggable (QSFP) MSA, the optoelectronic module 100 may alternately be configured to comply with a variety of other MSAs that include a rigid pluggable connector. For example, the optoelectronic module 100 may be configured to be substantially compliant with the QSFP MSA.

When the optoelectronic module 100 is plugged into a connection interface of a host device, a dual-sided connector 106 may be configured to form a pluggable dual-sided electrically conductive connection with the connection interface of the host device. The dual-sided connector 106 may further allow the host device to physically retain the optoelectronic module 100 until the optoelectronic module 100 is purposefully unplugged from the host device. The dual-sided connector 106 may be disposed on an end section of a circuit. The dual-sided connector 106 may be disposed on a portion of the rigid flex PCB 110 that includes both of one or more flexible sections (e.g., one or more cap layers) and a rigid section (e.g., core layers) of a rigid flex PCB 110. The rigid flex PCB 110 may be made from multiple insulating layers, including flexible and rigid layers, as will be described in detail herein with reference to FIG. 2.

Conventional PCBs constructed using glass-reinforced laminate may not be suitable for high speed applications. For example, when a PCB with glass-reinforced laminate operates at a high frequency, significant parasitic capacitance and/or inductance may be incurred by transmission lines in the PCB, which can distort transmitted signals.

The rigid flex PCB 110 described herein may include a set of substrates that enables efficient transmission at a speed equal to or greater than 25 gigabits per second per channel. The efficient transmission may be achieved by a unique combination of wire bondable interconnects to flip-chip mounted die and placement of the flip-chip mounted die at least partially within (i.e., between the outer or exterior surfaces of) the rigid flex PCB 110.

Figure 2:
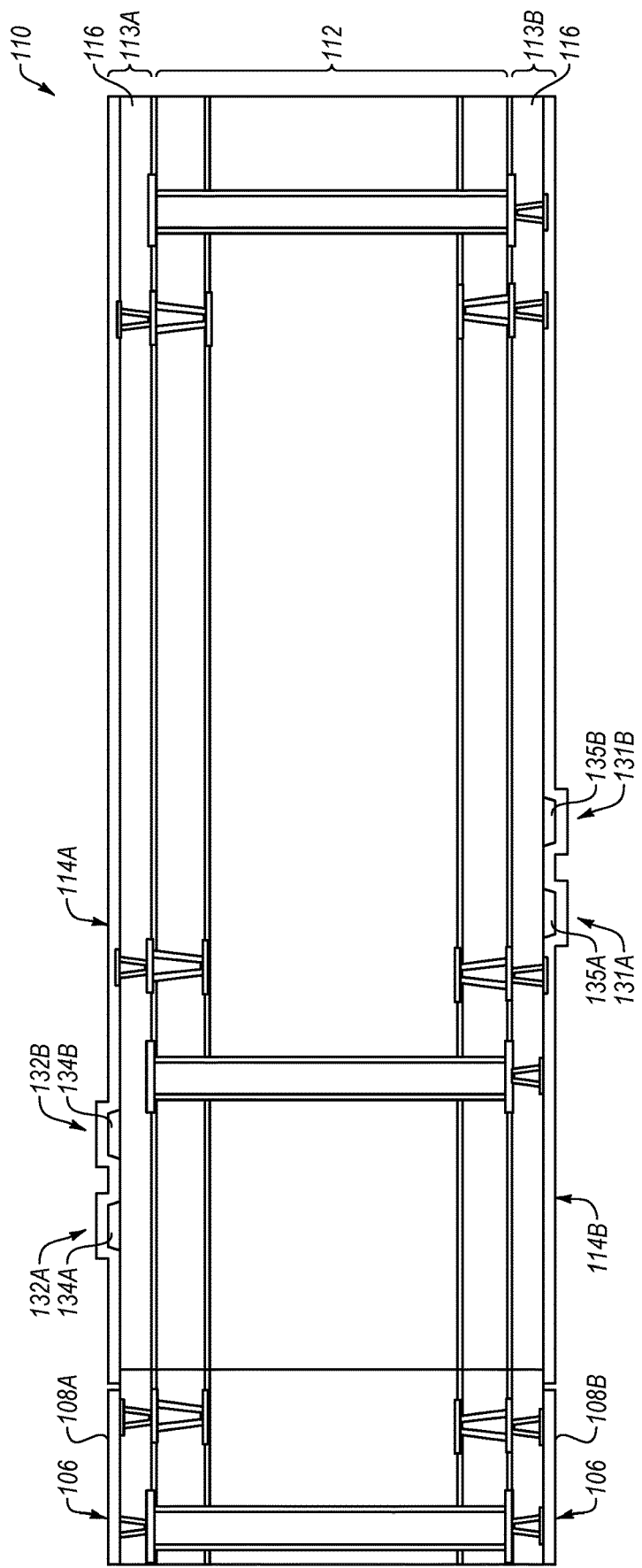
FIG. 2 is the cross-sectional view of an example rigid flex PCB.

FIG. 2 is the cross-sectional view of the rigid flex PCB 110. The rigid flex PCB 110 includes one or more flexible sections or cap layers 113A and 113B, and a rigid section or core layers 112. The cap layers 113 may be comprised of, for example, a polyimide material, an example of which is DuPont® AP7163 exhibiting a low Dk and Df. The rigid section or core layers 112 may be comprised of, for example, a material of one or more conductive and insulative layers such as FR4 sub-laminate. The cap layers 113 may be attached to the core layers 112 using an adhesive (not shown), an example of which is DuPont® LF7049 adhesive.

The high-frequency unreinforced laminate, namely the cap layer 113, may include a thin sheet of glass-free dielectric material 116 with a thickness of about 25-50 micrometers, with low relative permittivity (low Dk) and low loss tangent (low Df) compared to the reinforced laminate, namely the core layers 112.

By utilizing high-frequency cap layer 113 on the top and/or bottom of the core layers 112, connecting elements with super fine geometries may be constructed on the top side and the bottom side of the rigid flex PCB 110. For example, traces with a trace width between 50 micrometers and 60 micrometers, trace pitches with a pitch width between 100-130 micrometers, wire bond pads in a 60-micrometer scale, and BGA pitches smaller than 0.4 millimeters may be constructed on the top side and the bottom side of the rigid flex PCB 110, respectively. As a result, high-density interconnects may be routed on the top side and the bottom side of the rigid flex PCB 110, while low-speed components and power circuits may be routed and/or located in the internal layers of the rigid flex PCB 110.

The dual-sided connector 106 may be respectively disposed on faces 114A and 114B of the cap layers 113A and 113B near an edge of the rigid flex PCB 110. The dual-sided connector 106 may form an edge connector for connecting with a host device (not shown). The dual-sided connector 106 may include multiple contacts 108 to form a pluggable dual-sided electrically conductive connection with corresponding contacts (not shown) of a host device. Contacts 108A may be electrically coupled to a ground connection, as illustrated in FIG. 2, while other contacts 108A may be electrically coupled to signal transmission lines 132A and 132B (collectively "signal transmission lines 132") which may be configured as differential signals, or to one or more components (not shown) of the optoelectronic module 100. As illustrated in FIG. 2, the dual-sided connector 106 may include contacts 108B disposed on an opposite face on the cap layer 113B of rigid flex PCB 110.

One of the transmitter components 126 or the receiver components 128 of FIG. 1 may be electrically coupled, for example, to signal transmission lines 132A and 132B with the other one of the transmitter components 126 or receiver components 128 coupled to other signal transmission lines (not shown) on the same face 114 of the rigid flex PCB 110. Further, other transmitters and receivers may be coupled, for example, to the signal transmission lines 131A and 131B. Further, the signal transmission lines 132 and 131 may also be electrically coupled to respective contacts 108A and 108B. Preferably, the signal transmission lines 132 and 131 may be controlled-impedance transmission lines. For example, the signal transmission lines 132 and 131 may be controlled-impedance transmission lines with an impedance of 100 ohms including tolerances, for example, of +/−10%.

Although only two pairs of signal transmission lines 132 and 131 are shown, it will be appreciated that more signal transmission lines may be included in the rigid flex PCB 110. For example, in some embodiments, four signal transmission lines may be coupled to the transmitter components 126 and four signal transmission lines may be coupled to the receiver components 128. However, another number of signal transmission lines may couple the transmitter components 126 and/or receiver components 128 to contacts 108. Alternately or additionally, transmission lines may couple other circuitry (not shown) on the rigid flex PCB 110 to contacts 108.

As illustrated, the signal transmission line 132 may be differential signal transmission lines configured to transmit the incoming electrical data signal over a pair of differential conducive signal traces 134A and 134B. The differential conducive signal traces 134A and 134B may be disposed on one or more of the insulating layers of the cap layer 113A. Similarly, the signal transmission lines 131 may be differential signal transmission lines configured to transmit the incoming electrical data signal over a pair of differential conducive signal traces 135A and 135B. The differential conducive signal traces 135A and 135B may be disposed on one or more of the insulating layers of the cap layer 113B.

Surface finishing of the rigid flex PCB 110 may be performed using electroless nickel electroless palladium immersion gold (ENEPIG) or other suitable surface finishing. A surface finish created using an ENEPIG process may be referred to as an ENEPIG surface finish. ENEPIG surface finishes may include an electroless nickel plating covered by an electroless palladium plating covered by a thin layer of immersion gold.

The usage of high-frequency cap layer 113 of unreinforced laminate on the top and bottom sections of the rigid flex PCB and the usage of palladium in the surface finish may allow connecting elements with super fine geometries to be deposited on the top side and the bottom side of the hybrid PCB. The super fine connecting elements (e.g., super fine traces with a width of about 50 micrometers) may enable the rigid flex PCB to operate at a speed equal to or greater than about 25 gigabits per second per channel in the optics products.

As data rates for electronic and optoelectronic systems continue to increase, further techniques may be required to reduce the parasitic capacitance and parasitic inductance that can compromise the signal integrity of the transmissions. Accordingly, reductions in these parasitic reactances may allow increases in the transmission frequencies while preserving the integrity of the transmissions.

Figure 3A:
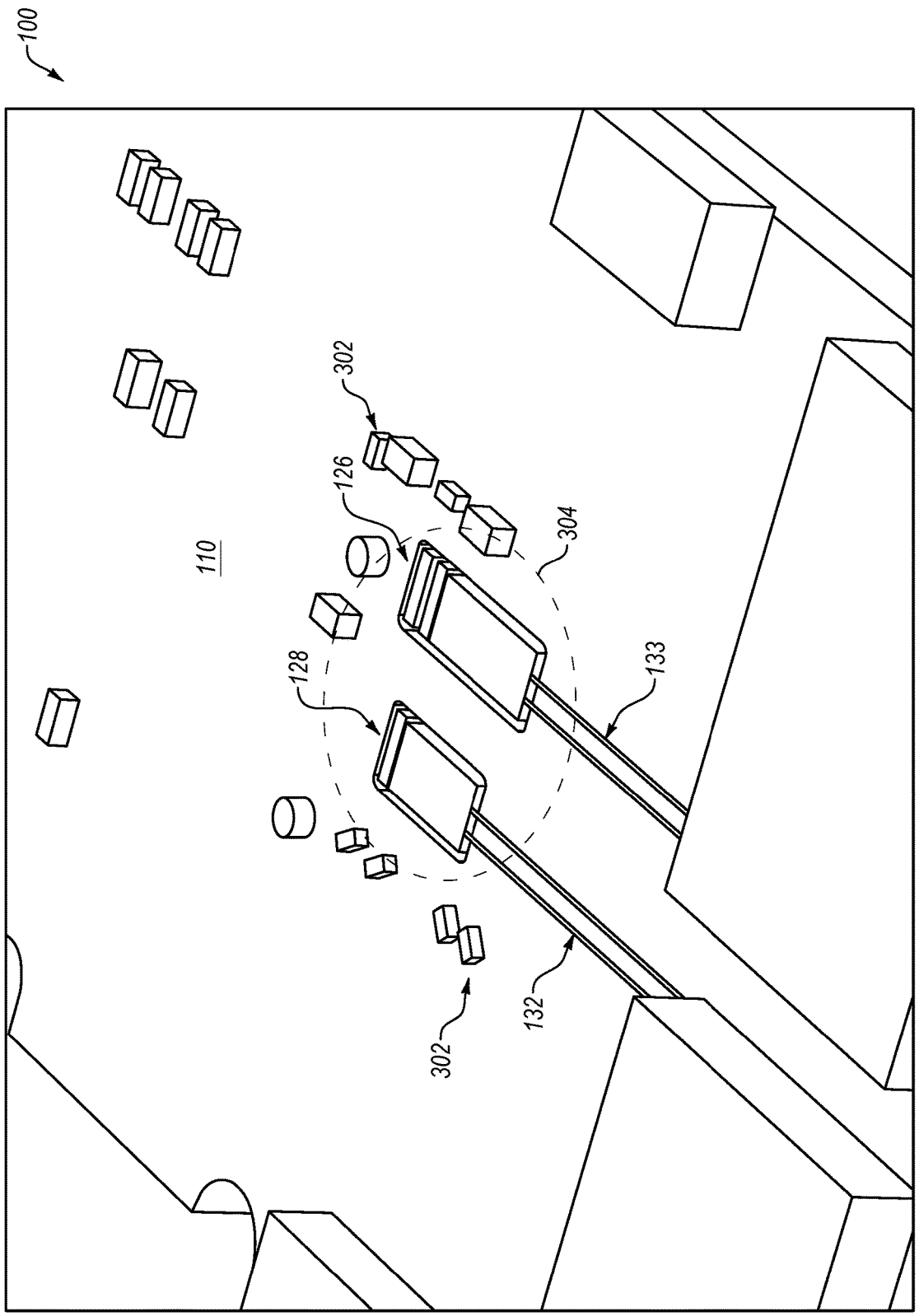
FIG. 3A illustrates an enlarged perspective view of a portion of the example optoelectronic module.

FIG. 3A illustrates an enlarged perspective view of a portion of the optoelectronic module 100 of FIG. 1. The optoelectronic module 100 may include various components 302 that may be surface mounted to the rigid flex PCB 110. The components 302 may include optoelectronic module components that acceptably operate at frequencies lower than the high-speed frequencies of the transmitter components 126 and the receiver components 128.

Many high-speed components, such as transmitter components 126 and receiver components 128 generate significant heat when operating. Accordingly, heat-dissipating structures, such as heat sinks, may be important for managing the generated heat. Conventionally, heat sinks were surface mounted to the top surface of a PCB with a die then mounted to a top side (side opposite the attachment with the PCB) of the heat sink. This topology resulted in long bonding wires coupling the bond pads of the die to the bond pads of the PCB. As stated, long bonding wire results in an increase in parasitic inductance which then results in decreased transceiving speeds.

Accordingly, the optoelectronic module 100 further includes a high-speed die-attach region 304 where other various components including, for example, the transmitter components 126 and the receiver components 128, may be mounted. In the example embodiments, the high-speed components may be at least partially recessed into the rigid flex PCB 110. By recessing the transmitter components 126 and the receiver components 128 in the z-dimension of the rigid flex PCB 110, the length of bonding wires connecting bond pads on the rigid flex PCB 110 with bond pads on the transmitter and receiver may be shortened, for example, by as much as 50%. The shortening of the bonding wires reduces at least the parasitic inductance introduced by the bonding wires in the signal transmission lines 132 and 133.

Figure 3B:
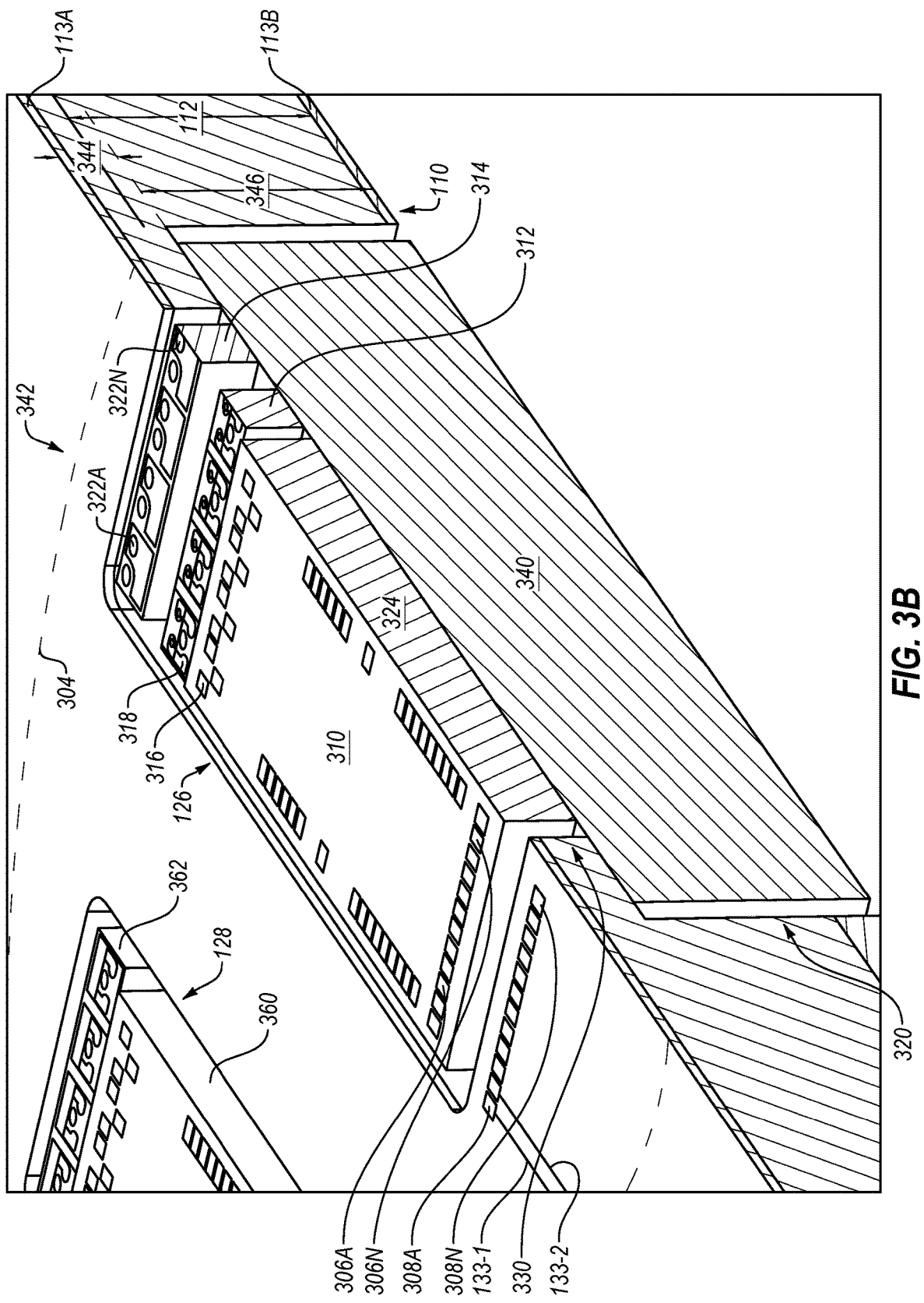
FIG. 3B is a perspective cross-sectional close-up view of a portion of a die-attach region as illustrated in FIG. 1 and FIG. 3A.

FIG. 3B is a perspective cross-sectional close-up view of a portion of the die-attach region 304 of FIGS. 1 and 3A. While the transmitter components 126 is illustrated in the cross-sectional view, the methods and systems described herein may also apply to the receiver components 128. The transmitter components 126 may include one or more components, including TXD input bond pads 306, that need to be wire bonded together and wire bonded to PCB input bond pads 308 on the rigid flex PCB 110. By way of example, the transmitter components 126 may include a transmitter driver (TXD) component 310 configured to receive electrical signals for transmission from transmission lines 133. The transmitter driver component 310 may include one or more TXD input bond pads 306A through 306N. The transmission lines 133-1 and 133-2 respectively couple to PCB input bond pads 308A and 308B. As discussed above, the transmitter components 126 and the receiver components 128 may support multiple channels, however for simplicity of illustration, only a single differential transmission line 133-1, 133-2 is illustrated in FIG. 3B.

The transmitter components 126 may further include a laser driver (LD) component 312 such as a VCSEL or VCSEL array. The laser driver (LD) component 312 may include LD input bond pads 318 that may be coupled to corresponding TXD output bond pads 316 on the transmitter driver component 310. Further, the transmitter components 126 may include a photo diode (PD) component 314 for monitoring the transmission intensity of the laser driver (LD) component 312. The photo diode component 314 may include PD output bond pads 322 that may be coupled to corresponding TXD PD input bond pads 324 on the transmitter driver component 310.

As stated, the rigid flex PCB 110 includes the core layers 112 and the cap layers 113A and 113B. In accordance with one or more embodiments, the die-attach region 304 of the rigid flex PCB 110 includes a cavity 320 formed in the core layers 112 and any cap layer 113B on the side opposite of the bond pads 308 of cap layer 113A. The cavity 320 may be formed by mechanical routing or other PCB material displacement techniques known by those of skill in the art. Further, the cavity 320 may be originally formed in the rigid flex PCB 110 during manufacturing of the rigid flex PCB or the manufacturing of the various components of the rigid flex PCB. Further, the overall thickness of the core layers 112 of the rigid flex PCB 110 generally dictate physical or mechanical displacement techniques for removing portions of the core layers 112 and any opposing side cap layer 113B. For example, to form the cavity 320. The cavity 320 may be formed to receive the heat sink 340. As illustrated in FIG. 3B, the heat sink 340 may be recessed below the top surface 342 of the rigid flex PCB 110.

As stated, the die-attach region 304 further includes a window 330 formed as a void in the cap layer 113A and a first portion 344 of the core layers 112. The window 330 may be formed according to various techniques including by laser cutting techniques known by those of skill in the art. The window 330 may be laser cut in part because the thickness of the cap layer 113A and the first portion 344 of the core layers may be thinner than the thickness of a second portion 346 of the core layers 112. The window 330 in the cap layer 113A may also be cut using other techniques including mechanical routing, pressing, punching, stamping, or the like.

The cavity 320 may be sized to receive the heat sink at least partially therein. Similarly, the window 330 may be sized to receive the components 310, 312, and 314 at least partially therein. In one embodiment, the window 330 may be smaller in at least one lateral dimension to provide a stop and to orient the heat sink 340 to the rigid flex PCB 110. Accordingly, the heat sink 340 may be inserted into the rigid flex PCB 110 through a bottom or back side that is opposite of the side with the bond pads. The heat sink 340 may be coupled to the rigid flex PCB 110 using adhesive such as epoxy, silver epoxy particularly for conductivity, or through other adhesive or mechanical retention processes known by those of ordinary skill in the art.

The window 330 may be sized to receive one or more of the components 310, 312, and 314 at least partially therein. The components 310, 312, and 314 may be inserted into the rigid flex PCB 110 through a top or front side of the rigid flex PCB 110 that includes the bond pads. A surface of the heat sink 340 mounted in the cavity 320 may form a base upon which the components 310, 312, and 314 may be mounted. The components 310, 312, and 314 may be retained to the surface of the heat sink 340 using an adhesive or by other physical or mechanical techniques known by those of ordinary skill in the art.

Figure 4:
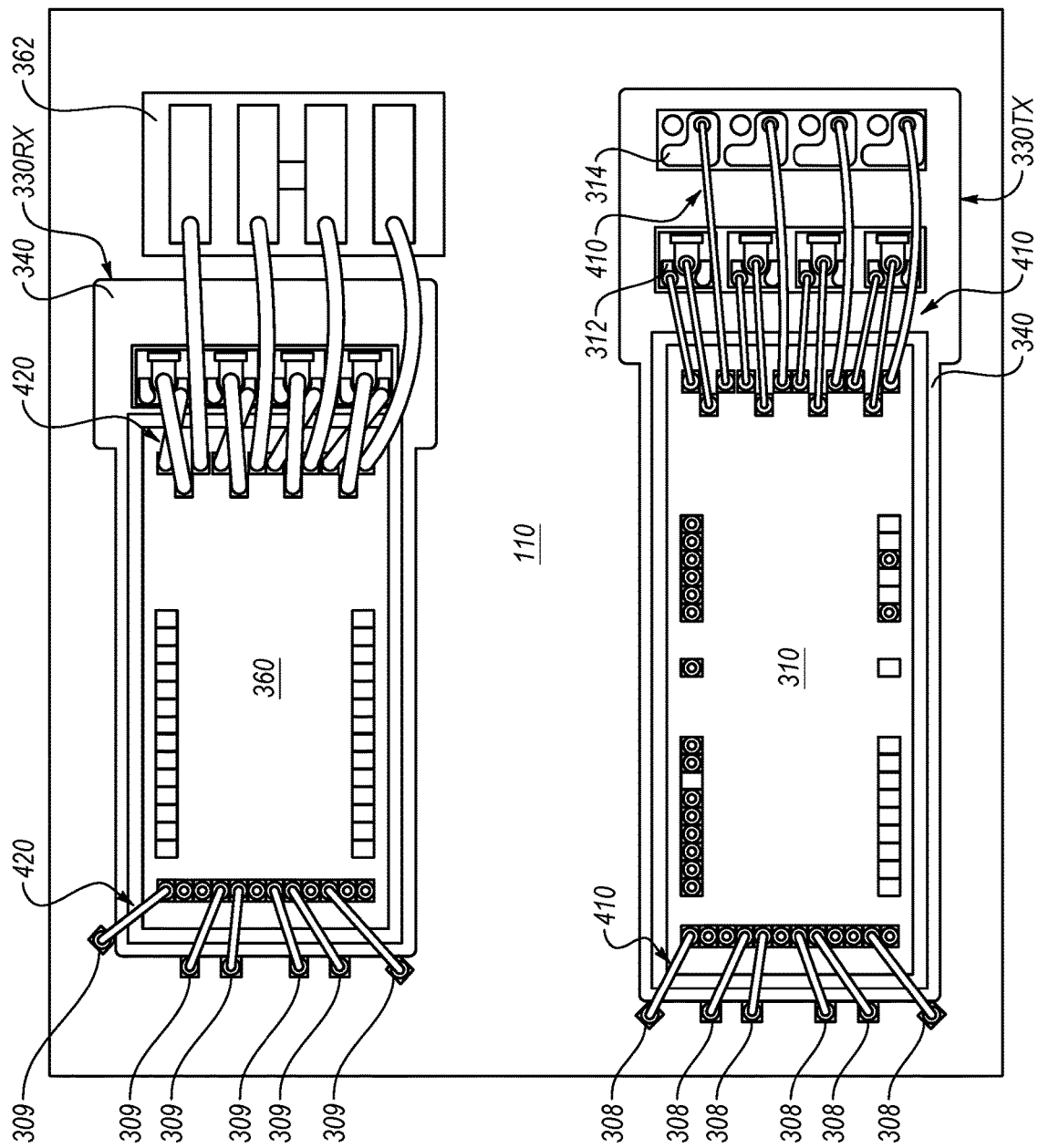
FIG. 4 is a top-view of interconnected components coupled to the example rigid flex PCB.

FIG. 4 is a top-view of interconnected components coupled to the rigid flex PCB. The window for the transmitter components 126 is illustrated as window 330TX and the window for the receiver components 128 is illustrated as window 330RX. The heat sink 340 couples to the rigid flex PCB 110 through the cavity (not shown) and forms the base in the window 330TX on which the transmitter components 310, 312, and 314 may be mounted. Further, the heat sink 340 couples to the rigid flex PCB 110 through the cavity (not shown) and forms the base in the window 330RX on which the receiver components such as an RX amplifier 360, and an RX photodiode (RXPD) 362 may be mounted. The components 310, 312, and 314 couple together using bonding wires 410 (only a portion are numbered) in a topology. Similarly, components including the RX amplifier 360 and components including the RX photodiode 362 couple together using bonding wires 420 (only a portion are numbered) in a topology.

FIG. 4 further illustrates exemplary dimensions between the components and an edge of the windows 330TX and 330RX. As illustrated, because the windows 330 may be created using a smaller tolerance cutting technique, such as laser cutting, the spacing between the components and the bond pads on the rigid flex PCB 110 may be reduced. A reduction in the spacing between bond pads on the rigid flex PCB 110 and respective bond pads on the components results in shorter bonding wires which also results in reduced parasitic inductance. Further, mounting the components on a base (surface of the heat sink) that may be recessed in the z-dimension of the rigid flex PCB 110 results in the ability to use shorter bonding wires for coupling between the bond pads of the components and the bond pads of the rigid flex PCB 110 which also results in reduced parasitic inductance.

Figure 5:
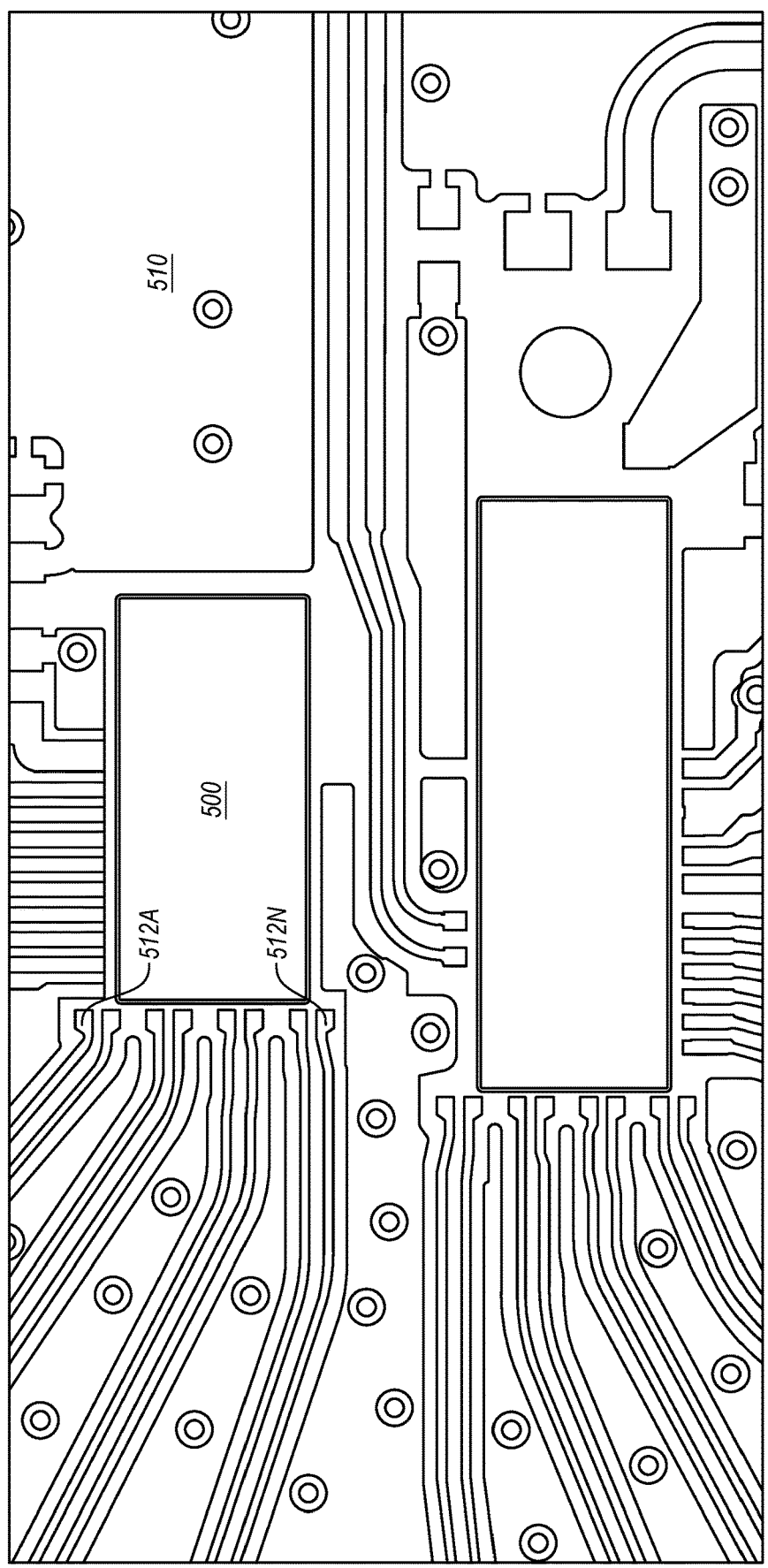
FIG. 5 is a top-view of a rigid flex PCB.

FIG. 5 is a top-view of a rigid flex PCB 510. Bond pads 512 may be typically formed on a PCB using an etching process that may be defined by a photographic process. Etching to form some geometries of bond pads may present usability challenges. For example, bond pads that are over-etched may not be usable in a wire bonding process. One geometry with sensitivity to etching processes are known as "peninsulas" which are shapes that have at least two outside corners. Outside corners on bonding geometries may be sensitive to over-etching rendering the geometry unusable.

Figure 6:
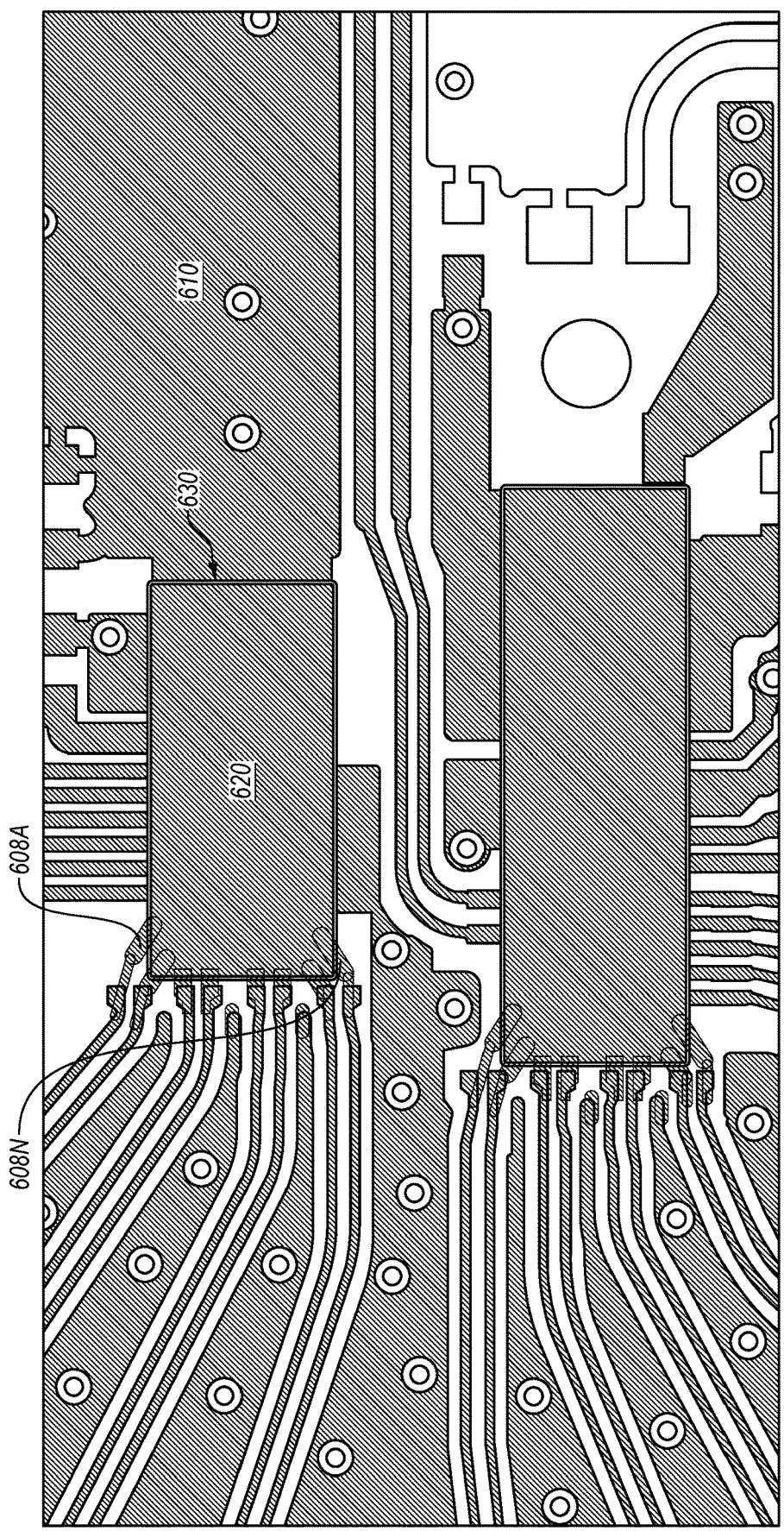
FIG. 6 is a top-view of the example rigid flex PCB before formation of a cavity or window.

FIG. 6 is a top-view of a rigid flex PCB before formation of a cavity or window, as described above. As stated, certain bonding geometries may present etching challenges. A rigid flex PCB 610 overcomes some of these challenges by including a shorting pad 620 formed within the boundary of window 630. The shorting pad 620 provides a common geometry to which all bond pads 608A-608N may be attached at least during the etching process. Attaching the bonding pads 608 to the shorting pad during the etching process creates inside corners at the ends of the bonding pads which may be less susceptible to over-etching during the fabrication process.

The shorting pad 620 allows adjacent bonding pads 608 to appear as parallel traces to each other while the shorting pad 620 may be attached during the etching process. Power, ground, and control signals may also be coupled to the shorting pad 620. Once the etching process is completed, the cavity 320 (FIG. 3B) may be formed as described above. Following the forming of the cavity 320, the window 630 may be formed using, for example, laser cutting techniques. The formation of window 630 results in the shorting pad 620 being excised from the rigid flex PCB 610. The formation of window 630 also results in the electrical separation of the bond pads 608 from each other. The separation of the bond pads by, for example, laser cutting away the shorting pad 620, results in the bond pads 608 extending to the edge of the window 630 which enables wire bonding to the components using shorter bonding wires further resulting in reduced parasitic inductance. Further, shorter length bond wires may also enable the use of thicker (e.g., 1 mil) bonding wires that also exhibit reduced inductance.

Figure 7:
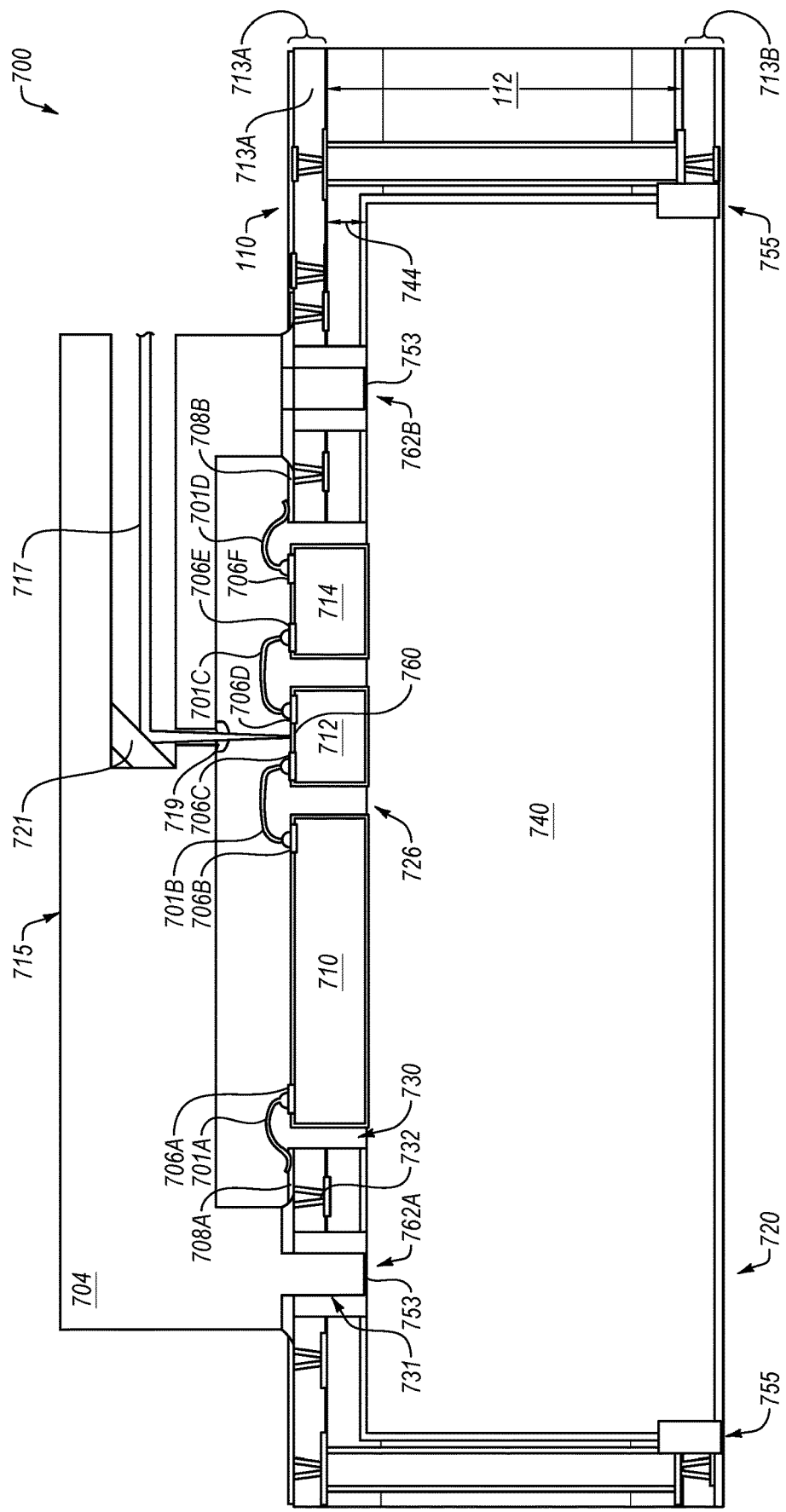
FIG. 7 is a cross-sectional diagram of a portion of the example optoelectronic module.

FIG. 7 is a cross-sectional diagram of a portion of an optoelectronic module. The optoelectronic module 700 includes electronic components and optical components. While FIG. 7 illustrates the electronic components for a transmitter, the techniques described herein also apply to a receiver.

The optoelectronic module 700 includes a transmitter 726, for example, which may include one or more components, each respectively including bond pads 706 for wire bonding components together and for wire bonding components to PCB bond pads 708 on the rigid flex PCB 110. By way of example, the transmitter 726 may include a transmitter driver (TXD) component 710 configured to receive electrical signals for transmission from transmission lines 732. The transmitter driver component 710 may include one or more TXD input bond pads 706A and one or more TXD output bond pads 706B. The transmission lines 732 (only one is shown for clarity) couple to PCB input bond pad 708A. While only transmission line 732 of a single transmission line 132 is illustrated, as discussed above, the transmitter 726 and a corresponding receiver (also not shown for clarity) may support multiple channels and may further include differential transmission lines as illustrated in FIG. 7.

The transmitter 726 may further include a laser driver (LD) component 712 such as a VCSEL or VCSEL array. The laser driver (LD) component 712 may include LD input bond pads 706D that may be coupled to corresponding TXD output bond pads 706B on the transmitter driver component 710 and LD output bond pads 706D. The laser driver (LD) component 712 may further include a laser diode (LD) 760 which converts an electrical signal to an optical signal 717. Further, the transmitter 726 may include a photo diode (PD) component 714 for monitoring the transmission intensity of the laser driver (LD) component 712. The photo diode component 714 may include PD input bond pads 706E and PD output bond pads 706F.

The transmitter 726 may further include bonding wires 701 for electrically coupling the components 710, 712, and 714 to each other and other bonding wires 701 for electrically coupling one or more components 710, 712, and 714 to the bond pads 708 on the rigid flex PCB 110. FIG. 7 illustrates the bonding wire 701A electrically coupling the bond pad 708A with the bond pad 706A, the bonding wire 701B electrically coupling the bond pad 706B with the bond pad 706C, the bonding wire 701C electrically coupling the bond pad 706D with the bond pad 706E, and the bonding wire 701D electrically coupling bond pad 706F to the bond pad 708B. Further bonding wires may be configured for electrically coupling intermediate components to the rigid flex PCB and for electrically coupling non-adjacent components.

As stated, a rigid flex PCB 110 includes the core layers 112 and the cap layers 713A and 713B. The rigid flex PCB 110 includes a cavity 720 formed in the core layers 112 and any cap layer 713B on the side opposite of the bond pads 708 of cap layer 713A. The cavity 720 may be formed to receive a heat sink 740 recessed below the top surface of the rigid flex PCB 110.

The rigid flex PCB 110 further includes a window 730 to receive the components 710, 712, and 714 at least partially therein. The components 710, 712, and 714 may be inserted into the rigid flex PCB 110 through a top or front side of the rigid flex PCB 110 that includes the bond pads 708. A surface of the heat sink 740 mounted in the cavity 720 may form a base upon which the components 710, 712, and 714 may be mounted.

An optoelectronic module also includes one or more lenses 719 for focusing and routing an optical signal. The lens 719 may be oriented and mounted to a structure 704 in the optoelectronic module 700. Surfaces, such as the surface of a PCB, with elevation variations over manufacturing processes may adequately provide sufficient mounting tolerances for lower frequency or higher intensity laser diodes, however, as operating frequencies increase and as component dimensions decrease, elevation variations contribute to misalignment of the lens with the laser diode.

In one embodiment, a lens component 715 including a lens 719 may be aligned and mounted to the heat sink 740. As stated above, a PCB such as the rigid flex PCB 110 may have exterior surfaces that may be susceptible to elevation variations due to manufacturing processes. In contrast, the heat sink 740 may be formed by machining or other processes that result in lesser elevation variations thereby resulting in an improved alignment of the lens component 715 with the laser diode 760.

Accordingly, the rigid flex PCB 110 further includes one or more lens mounting windows 762 formed in the cap layer 713A and a first portion 744 of the core layers 112. The one or more lens mounting windows 762 may be sized and shaped to allow a mounting portion 731 of the lens component 715 to pass through and contact a surface of the heat sink 740. Alternatively, the mounting portion 731 may be a separate component, such as a standoff, that provides an intermediate surface onto which the lens component 715 may be attached. The lens component 715 may include other elements such as a mirror 721 for redirecting the optical signal 717.

Once aligned with the heat sink 740, the lens component 715 may be retained using adhesive 753 which may be applied from and to various locations in the rigid flex PCB 110, including from adhesive insertion points 755. Further, mounting the lens component 715 to the heat sink 740 and through the voids of the one or more lens mounting windows 762 may increase the shear strength between the lens component 715 and the rigid flex PCB 110 by at least partially filling the voids of the one or more lens mounting windows 762.

Figure 8:
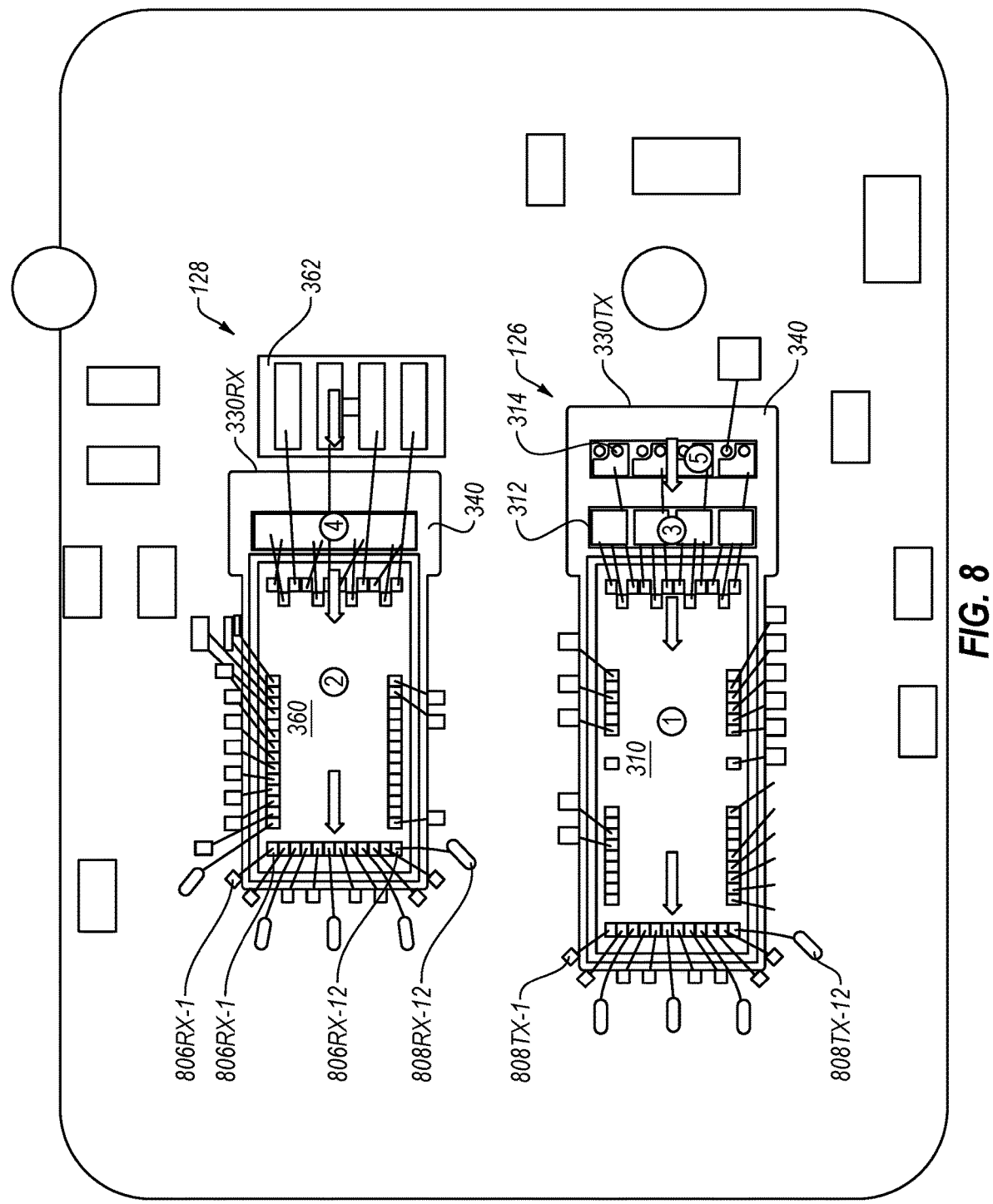
FIG. 8 is a top-view of a bonding diagram of the example optoelectronic module.

FIG. 8 is a top-view of a bonding diagram. As described above, a window provides a boundary within which the various electro-optical components may be located. Opto-electronic components may be manufactured with various dimension tolerances. While a window in the rigid flex PCB may be enlarged to accommodate the largest combination of tolerances for the electro-optical components, placement of opto-electronic components exhibiting a smaller range within the allowable tolerances within the enlarged window, may require longer bonding wires which results in an increase in the parasitic inductance.

An ordered placement of the various components, as illustrated in FIG. 8, may reduce the lengths of the bond wires for electrically coupling the components to the rigid flex PCB and for electrically coupling components to each other. A rigid flex PCB 110 may include a transmitter components 126 and a receiver components 128 for respectively transmitting and receiving optical signals. The transmitter components 126 may include a transmitter driver (TXD) component 310, a laser driver (LD) component 312, and a photo diode (PD) component 314. The receiver components 128 may include an RX amplifier 360 and an RX photo diode (RXPD) 362.

The window for the transmitter components 126 is illustrated as window 330TX and the window for the receiver components 128 is illustrated as window 330RX. The heat sink 340 couples to the rigid flex PCB 110 through the cavity (not shown) and forms the base in the window 330TX on which the transmitter components 310, 312, and 314 may be mounted. Further, the heat sink 340 couples to the rigid flex PCB 110 through the cavity (not shown) and forms the base in the window 330RX on which the receiver components such as an RX amplifier 360, and an RX photodiode (RXPD) 362 may be mounted.

Since the window 330 may be sized to receive components of maximum tolerances, a die-attachment order may be performed to reduce bonding wire lengths. The component of the transmitter components 126 distance-wise nearest the bonding pads 808TX on the rigid flex PCB 110 may be first placed nearest to the bonding pads 808TX. In the example of FIG. 8, the transmitter driver (TXD) component 310 may be placed nearest the bonding pads 808TX. Similarly, the component of the receiver components 128 distance-wise nearest the bonding pads 808RX on the rigid flex PCB 110 may next be placed nearest to the bonding pads 808RX. In the example of FIG. 8, the RX amplifier 360 may be placed nearest the bonding pads 808RX.

The die attach order continues by placement in the respective windows of components adjacent to the previously placed components. The laser driver (LD) component 312 may be placed in the window 330TX adjacent to the transmitter driver (TXD) component 310. Similarly, the RX photodiode (RXPD) 362 may be placed in the window 330RX adjacent to the RX amplifier 360. The die attach order may continue by placement in the respective windows of components adjacent to the previously placed components. For example, the photo diode (PD) component 314 may be placed in the window 330TX adjacent to the laser driver (LD) component 312.

The components 310, 312, and 314 may be coupled together using bonding wires as shown. Similarly, components including the RX amplifier 360 and components including the RX photodiode 362 may be coupled together using bonding wires as shown.

Figure 9:
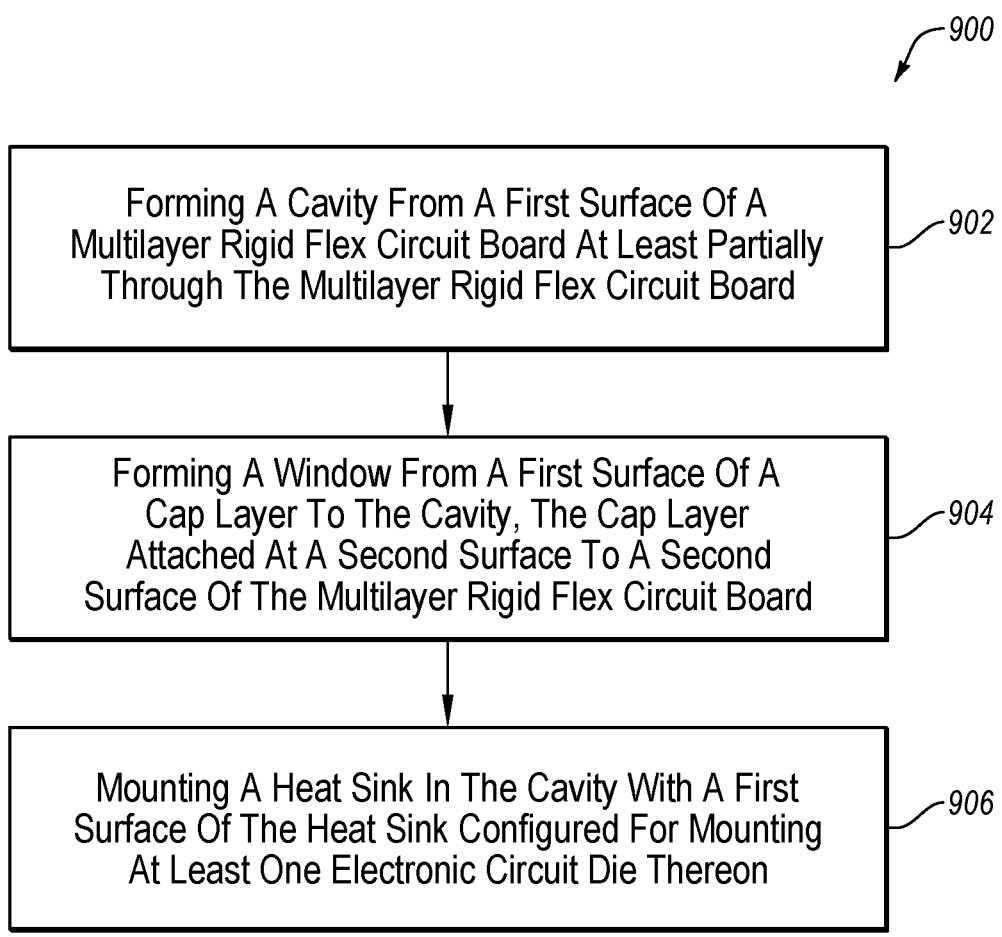
FIG. 9 is a flowchart of an example method of manufacturing the example circuit on a rigid flex PCB.

FIG. 9 is a flowchart of an example method of manufacturing the example circuit on a rigid flex PCB. The method 900 may be implemented, in some embodiments, to manufacture a circuit, such as a rigid flex PCB, upon which an electronic circuit die may be mounted as described with reference to FIGS. 1-8. It will be appreciated that the rigid flex PCB may be manufactured using a method other than the one disclosed here.

As shown in block 902, the method may include forming a cavity from a first outer surface of a multilayer rigid flex circuit board at least partially through the multilayer rigid flex circuit board.

As shown in block 904, the method may include forming a window from a first outer surface of a cap layer to the cavity, the cap layer attached at a second outer surface of the cap layer to a second outer surface of the multilayer rigid flex circuit board.

As shown in block 906, the method may include mounting a heat sink in the cavity with a first outer surface of the heat sink configured for mounting at least one electronic circuit die thereon.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module, comprising:
a printed circuit board including a core layer and a first cap layer affixed to a surface of the core layer, wherein the first cap layer comprises a material having a relative permittivity and a loss tangent that are both lower than a material comprising the core layer, the first cap layer defining a top side of the printed circuit board;
an optical transmitter window formed as a first void on the top side of the printed circuit board;
an optical receiver window formed as a second void on the top side of the printed circuit board;
a cavity formed as a third void opposite the first void and the second void on a bottom side of the printed circuit board;

a heat sink at least partially disposed in the cavity, the heat sink having a first side forming a bottom of the optical transmitter window and a bottom of the optical receiver window;

an optical transmitter circuit die including at least one transmitter die bond pad electrically coupled to the top side of the printed circuit board, the optical transmitter circuit die mounted to the bottom of the optical transmitter window;

an optical receiver circuit die including at least one receiver die bond pad electrically coupled to the top side of the printed circuit board, the optical receiver circuit die mounted to the bottom of the optical receiver window; and a lens mounted to the heat sink.

2. The optoelectronic module of claim 1, wherein the top side of the printed circuit board comprises at least one die-attach region, the at least one die-attach region including an optical transmitter window formed as the first void in the first cap layer and at least a portion of the core layer, the optical transmitter window having a base configured to receive the optical transmitter circuit die.

3. The circuit of claim 2, wherein the at least one circuit component includes at least one bond pad configured for connecting to at least one bond pad disposed on the top surface of the printed circuit board via a wire bond, and wherein the at least one circuit component is oriented on the base to minimize a length of the wire bond.

4. The optoelectronic module of claim 2, wherein the lens further includes a mounting portion extending through the printed circuit board defining a void to the heat sink.

5. The optoelectronic module of claim 1, wherein the heat sink is in thermal contact with at least one of the optical transmitter circuit die or the optical receiver circuit die.

6. The optoelectronic module of claim 1, wherein the printed circuit board further comprises a second cap layer affixed to a surface of the core layer opposite to the first cap layer and defining the bottom side of the printed circuit board, the second cap layer comprising a material having a relative permittivity and a loss tangent that are both lower than the material comprising the core layer.

7. The optoelectronic module of claim 1, further comprising a transceiver bond pad formed on the top surface of the printed circuit board, wherein at least a portion of the transceiver bond pad is formed by extending at least a portion of the transceiver bond pad into the optical transmitter window prior to forming the optical transmitter window.

8. The optoelectronic module of claim 7, wherein at least a portion of the transceiver bond pad on the printed circuit board is formed by coupling at least a portion of the transceiver bond pad to a shorting pad located within a region corresponding to the optical transmitter window.

9. The optoelectronic module of claim 1, wherein the at least one transmitter die bond pad and the at least one receiver die bond pad each connect to a corresponding printed circuit board bond pad via a wire bond and wherein the optical transmitter circuit die and the optical receiver circuit die are each oriented on the heat sink to minimize a length of the wire bond.

10. The optoelectronic module of claim 1, wherein the material of the first cap layer comprises a glass-free dielectric.

* * * * *